United States Patent [19]

Beasom

[11] 3,783,349

[45] Jan. 1, 1974

[54] FIELD EFFECT TRANSISTOR

[75] Inventor: James D. Beasom, Indian Harbour Beach, Fla.

[73] Assignee: Harris-Intertype Corporation, Cleveland, Ohio

[22] Filed: May 25, 1971

[21] Appl. No.: 146,737

[52] U.S. Cl. ...... 317/235 R, 317/234 N, 317/235 A, 317/235 G, 317/235 Z

[51] Int. Cl. ........ H01l 11/14

[58] Field of Search ........ 317/235 A, 235 Z, 317/235 G

[56] References Cited

UNITED STATES PATENTS

| | | | |
|---|---|---|---|
| 3,586,931 | 6/1971 | Nienhuis | 317/235 |
| 3,582,723 | 6/1971 | Kerr | 317/235 |

FOREIGN PATENTS OR APPLICATIONS

| | | | |
|---|---|---|---|
| 46/1,058 | 1/1971 | Japan | 317/235 B |

OTHER PUBLICATIONS

Carley et al., "Overlay Transistor", Electronics, Aug. 23, 1965, pages 70–71.

*Primary Examiner*—Rudolph V. Rolinec
*Assistant Examiner*—William D. Larkin
*Attorney*—Donald R. Greene

[57] ABSTRACT

A field effect transistor fabricated at least partially in a body of semiconductor material has a plurality of regions of one conductivity type adjacent a surface of the body, and has a gate overlying a plurality of intersecting channels of like conductivity type between the regions. Contacts in each of the regions are interconnected by a metallization pattern such that the regions form an array of alternating sources and drains, each source and drain being separated by a channel.

12 Claims, 5 Drawing Figures

INVENTOR
JAMES D. BEASOM

FIELD EFFECT TRANSISTOR

BACKGROUND OF THE INVENTION

1. Field of the Invention

The invention described herein resides generally in the field of semiconductor devices, and is particularly directed to a new field effect transistor configuration.

2. Prior Art

As is well known, the field effect transistor (FET) is a semiconductor device whose operation depends on the flow of majority carriers. For that reason the device is often referred to as a "unipolar" transistor, in contrast to the conventional "bipolar" transistor which relies on flow of majority and minority carriers. In the FET, carrier flow is from a source region to a drain region via a channel therebetween, and the magnitude of the current for any given drain bias voltage depends upon the bias voltage on the gate regions above (upper, or top gate) and below (lower, or bottom gate) the channel. Increments of gate bias generate a family of pentode-like characteristic output curves of drain current versus drain voltage.

The resistance $R_o$ of the FET for low values of drain bias voltage is directly proportional to the resistivity (p) and the length (1, measured parallel to direction of current flow) of the channel, and is inversely proportional to the cross-sectional area (A, normal to the current path) of the channel. Since A is the product of the thickness (a) and width (z) of the channel, FET resistance $R_o$ is inversely proportional to channel width (gate width), while transconductance ($g_m$) is directly proportional to channel width.

Gate capacitance ($C_g$) enters into a common expression for figure of merit (FM) for the junction FET, as follows:

$$FM = 1/R_o\ C_g\ = g_{m/}C_g \quad (1)\ ps$$

Reference is now made to FIGS. 1 and 2, showing the top view geometric pattern and a fragmentary perspective cross-section, respectively, of a prior art junction FET having n channels. Typically, the device is fabricated in a single crystal silicon wafer 10 doped to P-type conductivity (e.g., 10 ohm-cm), on which a thin (say 8 $\mu$thick) N type (e.g., 1.5 ohm-cm) epitaxial layer 12 is grown. An oxide mask is grown on the surface of layer 12 and is selectively removed to reveal a rectangular ring region 15 defining the outer edge or boundary of the FET (other similar FETs may simultaneously be fabricated in the same wafer 10). A P-type (boron) diffusion is made into this boundary area 15, to a depth of penetration entirely through epitaxial layer 12 such that the now-P-type boundary 15 contacts the original wafer, or substrate, 10. This constitutes an isolation diffusion defining the physical extremities of the FET and thereby limiting the extent of the source and drain regions along the periphery of the device, as well as providing a top surface contact to the bottom gate, constituting substrate 10.

Top gate stripes are next formed in epitaxial layer 12 by P type (boron) diffusion through oxide mask apertures to a depth less than the thickness of that layer, for example to 5 $\mu$, and to a width such that each gate stripe contacts the isolation diffusion at boundary area 15 at both sides of the stripe. These gate stripes, hereinafter referred to as top gate regions, are designated in FIGS. 1 and 2 by reference number 17. The top and bottom gates are thereby connected through a continuous P-type region consisting of the gates themselves and the boundary area 15.

Source and drain contact regions 19, 20 are defined by a further oxide masking operation on the surface of the epitaxial layer 12, and are provided by N-type (phosphorus) diffusion in paths between the top gate regions (and the boundary area edges) within the confines of the exposed regions of the N-type epitaxial layer itself. This diffusion is typically carried out to a relatively slight depth (compared to the top gate diffusion), say 2 $\mu$ in the case of the previously described dimensions, and to provide these contact regions with a resistivity of about 2 ohms per square. i.e., a resistivity less than that of the epitaxial layer. The contact region resistance appears in series circuit with the resistance of the channel between the source and drain regions of the device.

Finally, an appropriate metal contact layer is deposited (e.g., by evaporation) in a desired interconnect pattern (not shown) for the source contact regions, the drain contact regions, and the gate, respectively.

It will be apparent from expression (1), above, that the figure of merit FM of the FET is limited by the surface area of the device and by the gate width z, since the transconductance $g_m$ is proportional to gate width, and the gate capacitance is proportional to surface area (contribution of bottom gate).

SUMMARY OF THE INVENTION

It is the principal object of the present invention to improve the figure of merit of the FET for a given device surface area, over what was attainable using the geometry of FIGS. 1 and 2.

It is another object of the present invention to minimize the surface area of semiconductor wafer required for each FET for a given FET resistance $R_o$ or transconductance $g_m$.

If the surface area of the semiconductor wafer required to be occupied by each FET unit to be fabricated in the wafer can be minimized without departing from state-of-the-art process techniques, and for a given $R_o$ (or $g_m$), then quite clearly, the greatest number of units can be fabricated in the wafer and, hence, the greatest yield is obtained, utilizing existing techniques. This is an extremely important objective, and it is realized according to the present invention by a maximization of gate width, or, what is the same thing, of channel width. However, in attaining the maximum gate width per unit surface area it is essential that the distance between the source or drain contact and the channel be maintained at a relatively minimum amount throughout the FET suface layer. Otherwise, the current path length is undesirably increased, and with it, the resistance of the FET. Thus, for example, the provision of a serpentine top gate region would not achieve the desired objective because while tending toward maximizing the gate width per unit surface area of the device, it places the drain contact (or source contact) a substantial distance from the channel at the remote bends in the gate region.

Briefly, according to the present invention, the stripes forming the top gate are formed to intersect each other so as to increase the gate width over what is available where parallel stripes are employed. Moreover, the intersecting stripes define enclosed regions in the surface layer of the device, which provide alternate source and drain regions whose respective contacts (preferably located centrally of the regions) are reasonably close to the channel.

According to a preferred embodiment of the invention, the gate stripe intersections are arranged to produce a rectangular (optimally, square) grid of source and drain regions.

BRIEF DESCRIPTION OF THE DRAWINGS

In describing a preferred embodiment of the invention, reference will be made to the accompanying figures of drawing, in which.

Figure 1:
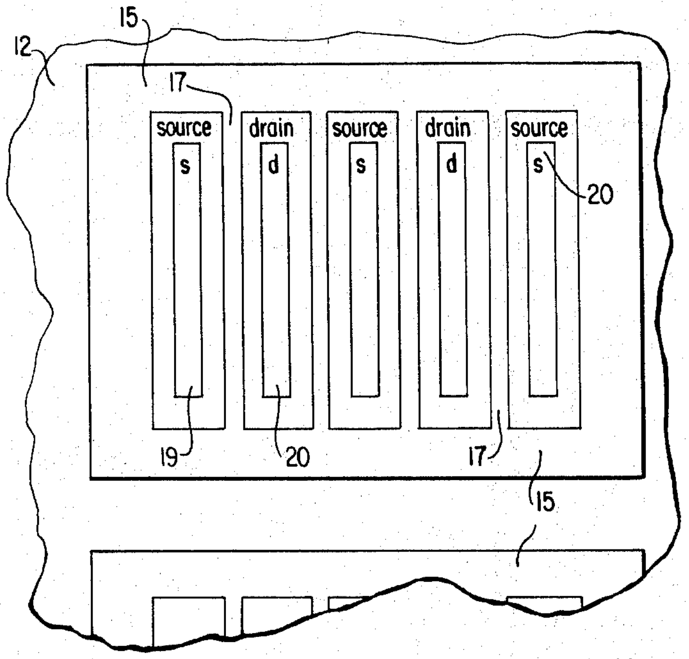
FIG. 1 (PRIOR ART)
FIGS. 1 and 2 are respectively a plan view and a fragmentary cross-sectional view in perspective of a prior art FET structure, described above.
Figure 2:
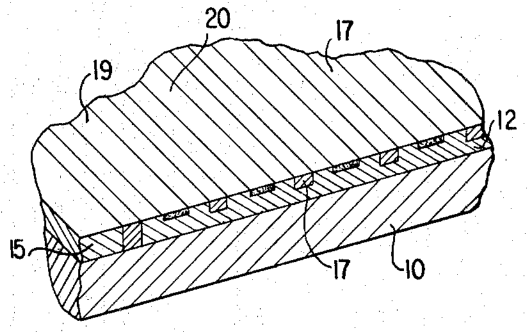
FIG. 2 (PRIOR ART)
Figure 3:
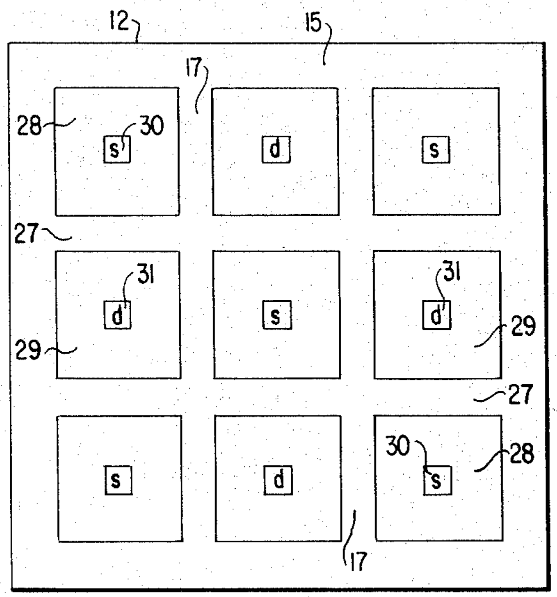
FIGS. 3 and 4 are similar to FIGS. 1 and 2, for a preferred embodiment of the present invention.

DETAILED DESCRIPTION OF A PREFERRED EMBODIMENT:

Referring now to FIG. 3, a particularly efficient embodiment of the invention is achieved where the top gate geometry is a square grid. That is to say, gate stripes 17 and gate stripes 27 intersect at right angles and define substantially equal sided source regions 28 and drain regions 29 in an alternating pattern. The fabrication of the structure of FIG. 3 is accomplished in precisely the same manner as is the prior art parallel stripe top gate FET, described above, i.e., using completely conventional process steps, except that the intersecting stripes 27 are also formed and an alternating pattern of source and drain regions is defined.

It will be understood that the invention does not depend upon the use of a square grid top gate. For example, a curved stripe pattern may be employed, or straight stripes intersecting at other than right angles, although some form of rectangular grid is clearly the simpler geometry and is more easily fabricated and reproduced.

Figure 4:
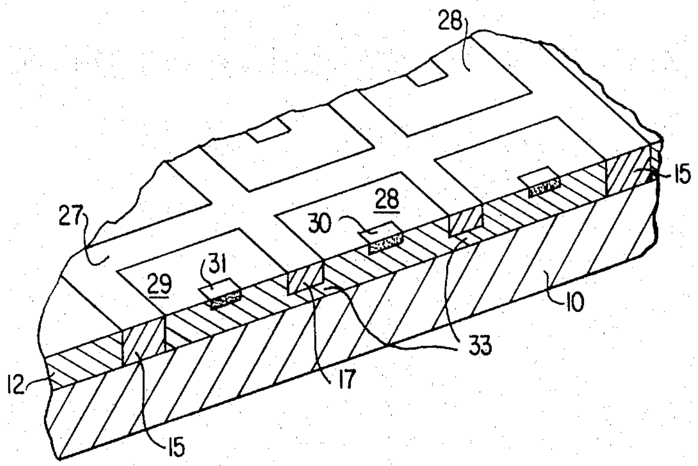

Source and drain contacts 30 and 31 are formed centrally in source and drain regions 28 and 29, respectively, thereby providing the lowest resistance path (least distance) between the contacts and the channel in all directions. As shown more clearly in FIG. 4, the channel 33 lies directly beneath the top gate region and between the source and drain regions.

Figure 5:
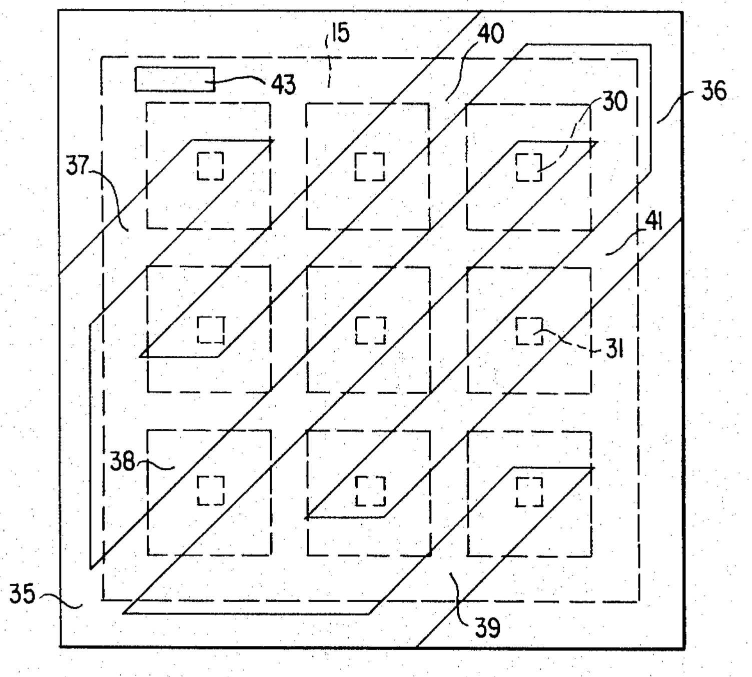
FIG. 5 is a top view pattern of the embodiment of FIGS. 3 and 4, illustrating a suitable metallization interconnect.

In order to accumulate the current contributions for each discrete pair of source-drain regions as the overall current of the FET unit, and for application of appropriate bias voltages, a metallization pattern such as that shown in FIG. 5 is utilized. The paths 35, 36 of the metal layer are such that the source contacts 30 are interconnected by contact fingers 37, 38, 39 and the drain contacts 31 are interconnected by contact fingers 40, 41. In practice, of course, the metallization pattern is applied over a passivation layer, such as an oxide of the basic semiconductor material, on the surface of the device and in which the source and drain contacts are exposed. A gate contact aperture 43 is also provided in the boundary region 15. The top gate of grid structure and the bottom gate of planar structure may be connected together as in the device which has been described, although that is not necessary.

A multichannel epitaxial FET was fabricated in accordance with the principles of the present invention, as described above, in a 0.4 $\mu$ thick, 2 $\Omega$ - cm N type epitaxial silicon layer on a 10 $\Omega$ - cm P type silicon substrate. The top gate was formed by a 5 $\Omega$/ square, 1.8 $\Omega$ deep boron diffusion in intersecting stripes. Source and drain contacts were formed by 4$\Omega$/ square, 1.5 $\mu$deep phosphorus diffusion in the centers of the five-by-five array of substantially square source and drain regions. An aluminum metallization layer about 40 $\mu$-inches thick was depostied for interconnection of respective source and drain contacts. The pinch-off voltage ($V_p$) of this device is 800 my and its resistance $R_o$ is 900 $\Omega$.

The invention is not limited to junction FETS, but may be implemented in metal insulator semiconductor (MIS) FETs also known as isolated gate FETs (IGFET). The basic difference the two types of devices insofar as implementation of the present invention is concerned is that, unlike the junction FET, the IGFET requires a multilevel interconnect to permit metal contact to the source and drain contacts without short circuiting to the gate (which for the IGFET is simply a metal layer). This is readily achieved using the conventional two level interconnect technique, in which a first (lower) level of metallization provides electrical connection to the gate and a second (upper) level, insulated from the first, provides electrical connection between the source contacts and between the drain contacts.

Thus, while the invention has been described and illustrated by reference to a preferred embodiment, it will be appreciated that variation from the specific details of construction which have been disclosed herein may be resorted to by those skilled in the art without deviating from the spirit and scope of the invention, as defined in the following claims.

What is claimed is:

1. A field effect transistor, comprising a body of semiconductive material a plurality of regions of one conductivity type of said semiconductor material adjacent one major planar surface of said body, said plurality of regions constituting an array of source and drain regions alternating along a line of centers in each of mutually perpendicular directions along said surface, a gate overlying a plurality of intersecting channels of said field effect transistor, said channels being of like conductivity type to said one conductivity type and each constituting a strip bounded on one side by a source region and on the other side by a drain region, and first and second means each partially in the form of parallel spaced-apart interconnected conductive fingers, said first means having its fingers disposed at an angle to said line of centers and conductively interconnecting said source regions together, said second means having at least some of its fingers disposed between the fingers of said first means and conductively interconnecting said drain regions together.

2. The field effect transistor of claim 1 wherein said gate comprises a region of said semiconductor material of opposite conductivity type conforming in pattern to said intersecting channels and disposed between said source and drain regions adjacent said surface.

3. The field effect transistor of claim 1, wherein each of said first and second means further includes a distinct and different contact formed in each of said source and drain regions, the respective set of conductive fingers comprising a metallization pattern interconnecting the respective contacts in the source and drain regions.

4. The field effect transistor of claim 3 wherein each of said contacts is located at substantially the center of the respective region, at said one surface.

5. The field effect transistor of claim 2 wherein said gate forms a substantially rectangular pattern of intersecting lines.

6. The field effect transistor of claim 5 wherein at least some of said source and drain regions are substantially square in shape at said surface.

7. A field effect transistor, comprising
a body of semiconductor material,
a plurality of spaced-apart source and drain regions alternating in two mutually perpendicular directions along a major planar surface of and within said body,
strip-like regions of semiconductor material of said body between each pair of source and drain regions forming a plurality of intersecting channels separating the source and drain regions for current flow therebetween and
a gate lying and generally conforming to the pattern of said plurality of intersecting channels for selectively controlling the magnitude of said current flow.

8. A field effect transistor, comprising
a body of semiconductor material,
a plurality of source and drain regions formed in spaced-apart relationship in said body adjacent a major surfacing thereof and alternating in two distinct and different directions along said surface, said source and drain regions being of generally rectangular shape at said surface and each source region having an edge parallel to and coextensive with an edge of the adjacent drain region,
said source regions being electrically interconnected and said drain regions being electrically interconnected separately from said source regions such that upon proper biasing of the source and drain regions via the electrical interconnects a current flow is established in a strip-like channel of semiconductor material between each source region and an adjacent drain region, the cumulative current contributions appearing at the electrical interconnection of the drain regions, and
a gate in the form of a network of intersecting interconnected paths overlying the channels and conforming to the shape thereof to control, when electrically biased, the magnitude of the current flow in said channels.

9. The field effect transistor of claim 7, wherein said source and drain regions and said channels are of one conductivity type, and said gate is of opposite conductivity type,
and further including
another gate supporting said source and drain regions and said channels and being coextensive therewith within said body said another gate separated from said first gate by said channels.

10. The field effect transistor of claim 9, wherein separate source and drain contacts are formed in respective ones of said source and drain regions.

11. The field effect transistor of claim 10, further including
a first metal layer overlying said surface and electrically interconnecting said source contacts, and
a second metal layer electrically isolated from the first, further overlying said surface and electrically interconnecting said drain contacts. 16.

12. The field effect transistor of claim 11, wherein said channels and said first gate form a rectangular grid of intersecting lines.

* * * * *